(12) United States Patent
Hatano et al.

(10) Patent No.: US 6,472,255 B1
(45) Date of Patent: Oct. 29, 2002

(54) SOLID-STATE IMAGING DEVICE AND METHOD OF ITS PRODUCTION

(75) Inventors: Keisuke Hatano; Yasutaka Nakashiba, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/243,440

(22) Filed: Feb. 3, 1999

(30) Foreign Application Priority Data

Feb. 4, 1998 (JP) .......................................... 10-023200

(51) Int. Cl.$^7$ ........................ H01L 21/339; H01L 21/00
(52) U.S. Cl. ..................... 438/144; 438/60; 438/75; 438/145
(58) Field of Search ...................... 438/75, 144, 145, 438/60

(56) References Cited

U.S. PATENT DOCUMENTS

| | | | |
|---|---|---|---|
| 4,099,317 A | * 7/1978 | Su ............................. | 438/144 |
| 5,241,198 A | 8/1993 | Okada et al. ............... | 257/215 |
| 5,302,545 A | 4/1994 | Okada et al. ............... | 437/53 |
| 5,489,545 A | 2/1996 | Taguchi ..................... | 437/53 |
| 5,569,616 A | * 10/1996 | Ohki et al. ................ | 438/145 |
| 5,635,416 A | * 6/1997 | Chen et al. ................ | 438/258 |

FOREIGN PATENT DOCUMENTS

| | | |
|---|---|---|
| JP | 01-185970 | 7/1989 |
| JP | 2-220450 | 9/1990 |
| JP | 04-207043 | 7/1992 |
| JP | 05-3216 | 1/1993 |
| JP | 5-206438 | 8/1993 |
| JP | 8-111521 | 4/1996 |
| JP | 08-204142 | 8/1996 |

* cited by examiner

*Primary Examiner*—Matthew Smith
*Assistant Examiner*—Lex H. Malsawma
(74) *Attorney, Agent, or Firm*—Sughrue Mion, PLLC

(57) ABSTRACT

A solid-state imaging device comprises: an electric charge transfer portion for transferring an electric charge produced in a photodetector through photoelectric conversion from incident light to the electric charge; and, an output amplifier portion for detecting the electric charge to issue a signal. The charge transfer portion is provided with a first gate insulation film having a sufficient film thickness to keep a predetermined transfer efficiency. The output amplifier portion is provided with a second gate insulation film having a film thickness suitable for obtaining a predetermined mutual conductance capable of increasing the gain of the output amplifier portion.

3 Claims, 12 Drawing Sheets

3; horizontal charge transfer portion
4; output amplifier portion
6; first layer charge transfer electrode
8; second layer charge transfer electrode
15; gate insulation film
16; gate electrode
5; gate insulation film

SOLID-STATE IMAGING DEVICE AND METHOD OF ITS PRODUCTION

BACKGROUND OF THE INVENTION

1. Field of the Invention

The present invention relates to a solid-state imaging device and a method of its production, and more particularly to a solid-state imaging device and a method of its production, wherein the device comprises: an electric charge transfer portion provided with a gate insulation film constructed of a plurality of films which are different in thickness from each other; and, an output amplifier portion.

2. Description of the Related Art

Heretofore, a CCD (i.e., Charge Coupled Device) typical of the solid-state imaging devices has been known. Formed on a common substrate of this CCD are: a photodetector for performing photoelectric conversion from incident light to an electric charge; an electric charge transfer portion for transferring the electric charge thus converted in the photodetector; and, an output amplifier portion for detecting the electric charge to issue a signal. In this case, each of the photodetector, electric charge transfer portion and the output amplifier portion has a gate insulation film formed on the semiconductor substrate as one of its constituent elements, and serves its own function as described above.

FIG. 14 is a schematic diagram of a conventional solid-state imaging device (hereinafter referred to as a first prior art) used in the interline transfer system, for example. As is clear from this diagram, a photodetector 51 is constructed of a matrix of a plurality of photodiodes, which are formed in a light receiving region of a semiconductor substrate. Formed in this photodetector 51 are vertical charge transfer portions (i.e., vertical shift registers) 52 arranged in a vertical series, wherein an electric charge issued from the photodetector 51 is vertically transferred through these vertical shift registers 52. Formed under these vertical charge transfer portions 52 are horizontal charge transfer portions (i.e., horizontal shift registers) 53 arranged in a horizontal series, wherein the electric charge having been vertically transferred is then transferred horizontally through these horizontal shift registers 53. Formed adjacent to these horizontal shift registers 53 is an output amplifier portion 54.

FIG. 15 shows in cross section both the horizontal charge transfer portion 53 and the output amplifier portion 54. The horizontal charge transfer portion 53 comprises: a first layer charge transfer electrode 58 constructed of a polysilicon film and the like, the polysilicon film and the like being formed on an n-type semiconductor layer 56 which forms an electric charge transfer channel formed in a p-type semiconductor substrate 55; and, a second layer charge transfer electrode 60 constructed of a polysilicon film and the like, the polysilicon and the like being formed on the n-type semiconductor layer 56 through the first layer charge transfer electrode 58, oxide film 59 and the gate insulation film 57. The gate insulation film 57 is constructed of a multilayer film comprising a nitride film ($Si_3N_4$) 61 sandwiched between a pair of oxide films ($SiO_2$) 62, 64. Incidentally, though the photodetector is formed in the other portion of the p-type semiconductor substrate 55, it is omitted in the drawings.

On the other hand, the output amplifier portion 54 comprises in construction: a source region 65 and a drain region 66 each of which is constructed of an n-type semiconductor region formed in the other portion of the p-type semiconductor substrate 55; and, a MOS (Metal Oxide Semiconductor) transistor provided with a gate electrode 68 which is constructed of a polysilicon film and the like formed through a gate insulation film 67 constructed of an oxide film. Here, the MOS transistor is often used in a source follower grounded circuit which is excellent in impedance transformation properties. Incidentally, the vertical charge transfer portion 52 has substantially the same construction as that of the horizontal charge transfer portion 53.

FIGS. 16 to 20 show a conventional method of producing the solid-state imaging device of the first prior art, illustrating the producing steps of the method in the order of these steps. Hereinbelow, the conventional method will be described in the order of its steps.

First of all, as shown in FIG. 16, by using the p-type semiconductor substrate 55 on which the n-type semiconductor substrate 56 is formed, sequentially formed on the n-type semiconductor substrate 56 in the regions in which both the horizontal and the vertical charge transfer portion are formed in the following order are: the oxide film 62, nitride film 61 and the oxide film 63, of which films a multilayer film is constructed, As a result, the gate oxide films 57 and 67 are formed in the regions in which the horizontal charge transfer portion 53 and the output amplifier portion 54 are formed, respectively. Next, as shown in FIG. 17, only in the region in which the horizontal charge transfer portion 53 is formed, the first layer charge transfer electrode 58 constructed of a polysilicon film is formed through the gate oxidation film 57. Then, as shown in FIG. 18, all the oxide film 63 other than one directly under the first layer charge transfer electrode 58 is removed. After that, a CVD oxidation film 64 is newly formed through a high-temperature CVD (Chemical Vapor Deposition) process. Subsequent to this process, as shown in FIG. 19, the polysilicon film forming the first layer charge transfer electrode 58 is subjected to an oxidation process to develop an oxide film on both its upper and side surface portions. Due to this, the oxide film 64 of both the upper and side surface portions of the first layer charge transfer electrode 58 is increased in film thickness. The reason why the above film thickness is increased is that it is necessary to have the first layer charge transfer electrode 58 sufficiently insulated from a second layer charge transfer electrode 60 which is formed later. Subsequent to this step, now, as shown in FIG. 20, after a polysilicon film is formed on the entire surface of the CVD oxidation film 64, the thus formed polysilicon film is patterned using a photolithography processing such that both the second layer charge transfer electrode 60 and the gate electrode 68 are formed. After that, by self alignment using the gate electrode 68 as a mask, an n-type impurity is ion-implanted in the semiconductor substrate 55 to form an n-type source electrode 65 and an n-type drain electrode 68, so that a MOS transistor 69 is produced. Through the above process steps, the solid-state imaging device of the first prior art type (shown in FIG. 15) is produced.

FIG. 21 shows a second prior art in cross section. The main difference between this second prior art and the first prior art is that the second prior art discloses a horizontal charge transfer portion constructed of a single layer. In other words, as shown in the drawings, in the horizontal charge transfer portion 53, an electric charge transfer electrode 70 constructed of a polysilicon film and the like is formed on the n-type semiconductor substrate 56 through the gate insulation film 57. Incidentally, other than the above difference, there is substantially no difference between the first and the second prior art. Though like reference numerals apply to similar parts through FIGS. 16 to 20 in construction, this is also true in FIG. 21. Consequently, to avoid redundancy in description of the reference numerals, such description is omitted.

FIGS. 22 and 23 show process steps for producing the solid-state imaging device of the second prior art. First, as shown in FIG. 22, the p-type semiconductor substrate 55 on which the n-type semiconductor layer 56 is previously formed is used to produce an oxide film by using a thermal oxidation process in a region where both the horizontal charge transfer portion and the output amplifier portion are to be formed, so that the gate insulation films 57, 67 are formed. Then, as shown in FIG. 23, a polysilicon film is formed to cover the entire surfaces of these gate insulation films 57, 67. After that, the thus formed polysilicon film is patterned by using a photolithography process, so that the charge transfer electrode 70 and the gate electrode 68 are formed. Then, by self alignment using the gate electrode 68 as a mask, an $n^+$-type source region 65 and an $n^+$-type drain region 66 are formed. Through the above-mentioned process steps, the solid-state imaging device of the second prior art (shown in FIG. 21) is produced.

By the way, a common feature for the first and the second prior art (FIGS. 15 and 21) is that the gate insulation film 57 of the horizontal charge transfer portion 53 is equal in film thickness to the gate insulation film 67 of the MOS transistor 69 of the output amplifier portion 54.

In general, in the charge transfer portion of the solid-state imaging device, it is necessary for its gate insulation film 57 to have a thickness sufficient to keep a predetermined charge-transfer efficiency, which means that the gate insulation film 57 is relatively large in thickness. On the other hand, in the output amplifier portion 54, it is necessary for the gate insulation film 67 of the MOS transistor to have a film thickness suitable for obtaining a predetermined mutual conductance capable of increasing the gain of the output amplifier portion 54, which means that the gate insulation film 67 is relatively small in film thickness. However, it is not possible to satisfy both the requirements of the gate insulation films 57, 67 in film thickness at once. However, in the solid-state imaging device, since priority should be given to keeping the charge transfer efficiency high in the charge transfer portion, it can't help for the gate insulation films being relatively large in film thickness, and, therefore sacrificing the gain in the output amplifier portion.

Here, as for the gate insulation films, Japanese Patent Laid-Open No. Hei 5-206438 discloses a solid-state imaging device having a construction in which a gate insulation film of its electric charge transfer portion differs in film construction from the gate insulation film of its output amplifier portion.

FIG. 24 is a cross-sectional view of the solid-state imaging device disclosed in the above Japanese Patent Laid-Open document, in which a gate insulation film 75 of an electric-charge transfer portion 74 is formed on a semiconductor substrate 71, and provided with a first layer charge transfer electrode 72 and a second layer charge transfer electrode 73. This gate insulation film 75 is constructed of an oxide film having a MONOS (Metal Oxide Nitride Oxide Semiconductor) arrangement. On the other hand, the gate insulation film 78 of the MOS transistor 77 of an output amplifier portion 76 of the device is constructed of an oxide film having a MOS arrangement. This construction is capable of stabilizing in thickness the gate insulation film 75 of the charge transfer portion 74, and also stabilizing $V_{TH}$, in the output amplifier portion 76 by averting the influence of traps in the gate insulation film 78.

However, in the prior art described in the above Japanese Patent Laid-Open document, since the gate insulation films formed in both the charge transfer portion and the output amplifier portion differ from each other in properties so as to accomplish their individual purposes, it is difficult to keep the transfer efficiency high in the charge transfer portion and also difficult to increase the gain of the output amplifier portion. In other words, in the prior art described in the above Japanese Patent Laid-Open document, since it is an object of this prior art to obtain the oxide film stable in film thickness in the charge transfer portion; and to obtain the oxide film stable in $V_{TH}$ in the output amplifier portion, there is no consideration of the relationship between the oxide film of the charge transfer portion and that of the output amplifier portion.

SUMMARY OF THE INVENTION

Under such circumstances, the present invention was made. Consequently, it is an object of the present invention to provide a solid-state imaging device and a method of its production, wherein the device is capable of: keeping high the transfer efficiency of its charge transfer portion; and, increasing the gain of its output amplifier portion.

According to a first aspect of the present invention, the above object of the present invention is accomplished by providing:

In a solid-state imaging device comprising: an electric charge transfer portion for transferring an electric charge produced in a photodetector through photoelectric conversion from incident light to the electric charge; and, an output amplifier portion for detecting the electric charge to issue a signal; the improvement wherein:

the charge transfer portion is provided with a first gate insulation film having a film thickness sufficient to keep its transfer efficiency high; and the output amplifier portion is provided with a second gate insulation film having a film thickness suitable for obtaining a mutual conductance capable of increasing the gain of the output amplifier portion.

According to a second aspect of the present invention, the above object of the present invention is accomplished by providing:

The solid-state imaging device as set forth in the first aspect of the present invention, wherein: the output amplifier portion is constructed of a MIS transistor.

According to a third aspect of the present invention, the above object of the present invention is accomplished by providing:

The solid-state imaging device as set forth in the first aspect, wherein: the first gate insulation film is different in thickness from the second gate insulation film.

According to a fourth aspect of the present invention, the above object of the present invention is accomplished by providing:

The solid-state imaging device as set forth in the first aspect, wherein: the first gate insulation film is larger in thickness than the second gate insulation film.

According to a fifth aspect of the present invention, the above object of the present invention is accomplished by providing:

The solid-state imaging device as set forth in the first aspect, wherein: the first gate insulation film is constructed of a multilayer film comprising a nitride film sandwiched between a pair of oxide films; and, the second gate insulation film is constructed of an oxide film.

According to a sixth aspect of the present invention, the above object of the present invention is accomplished by providing:

The solid-state imaging device as set forth in the first aspect, wherein: the first gate insulation film is constructed of a multilayer film comprising a thermal oxidation film and a CVD oxidation film; and, the second gate insulation film is constructed of a thermal oxidation film or a CVD oxidation film.

According to a seventh aspect of the present invention, the above object of the present invention is accomplished by providing:

The solid-state imaging device as set forth in the first aspect, wherein: each of the first and the second gate insulation film is constructed of a single film.

According to an eighth aspect of the present invention, the above object of the present invention is accomplished by providing:

A method for producing a solid-state imaging device comprising: a charge transfer portion for transferring an electric charge produced in a photodetector through photoelectric conversion from incident light to the electric charge; and, an output amplifier portion for detecting the electric charge to issue a signal; wherein the charge transfer portion is provided with a first gate insulation film having a sufficient film thickness to keep a predetermined transfer efficiency, and the output amplifier portion is provided with a second gate insulation film having a film thickness suitable for obtaining a predetermined mutual conductance capable of increasing the gain of the output amplifier portion; the method comprising the steps of:

forming an insulation film, in which a multilayer film is formed by stacking a thermal oxidation film, a nitride film and a first CVD oxidation film together in the order of mention in a region where the charge transfer portion and the output amplifier portion are formed on a semiconductor substrate;

forming a first layer charge transfer electrode in a region where the charge transfer portion is formed;

forming a second CVD oxidation film after all the first CVD oxidation film except one immediately under the first layer charge transfer electrode is removed;

oxidizing the first layer charge transfer electrode to increase the second CVD oxidation film in its film thickness;

removing the insulation film of the region where the output amplifier portion is formed;

forming an oxide film serving as a gate insulation film in the region where the output amplifier portion is formed to increase in film thickness the second CVD oxidation film of the region where the charge transfer portion is formed; and forming a second layer charge transfer electrode through both the multilayer film and the second CVD oxidation film in the region where the charge transfer portion is formed, and simultaneously forming a gate electrode in the region where the output amplifier portion is formed.

According to a ninth aspect of the present invention, the above object of the present invention is accomplished by providing;

A method for producing a solid-state image pickup device comprising the steps of:

forming an insulation film formed of a single film in a region in which both a charge transfer portion and an output amplifier portion are formed over a semiconductor substrate;

removing the insulation film in a region in which the output amplifier portion is formed;

performing an oxidation step, whereby an oxide film forming a gate insulation film is formed in the region in which the output amplifier portion is formed, and the single film formed in a region in which the charge transfer portion is formed is increased in film thickness; and forming a charge transfer electrode and a gate electrode, wherein the charge transfer electrode is formed through the single film in the region in which the charge transfer portion is formed, and the gate electrode is formed in the region in which the output amplifier portion is formed.

According to a tenth aspect of the present invention, the above object of the present invention is accomplished by providing:

The method for producing the solid-state imaging device, as set forth in the eighth aspect of the present invention, wherein: both a source and a drain are formed in the region where the output amplifier portion is formed to form a MIS transistor, by self alignment using the gate electrode as a mask.

According to an eleventh aspect of the present invention, the above object of the present invention is accomplished by providing:

The method for producing the solid-state imaging device, as set forth in the eighth aspect of the present invention, wherein: each of the first and the second layer charge transfer electrode is constructed of a polysilicon film.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Figure 1:
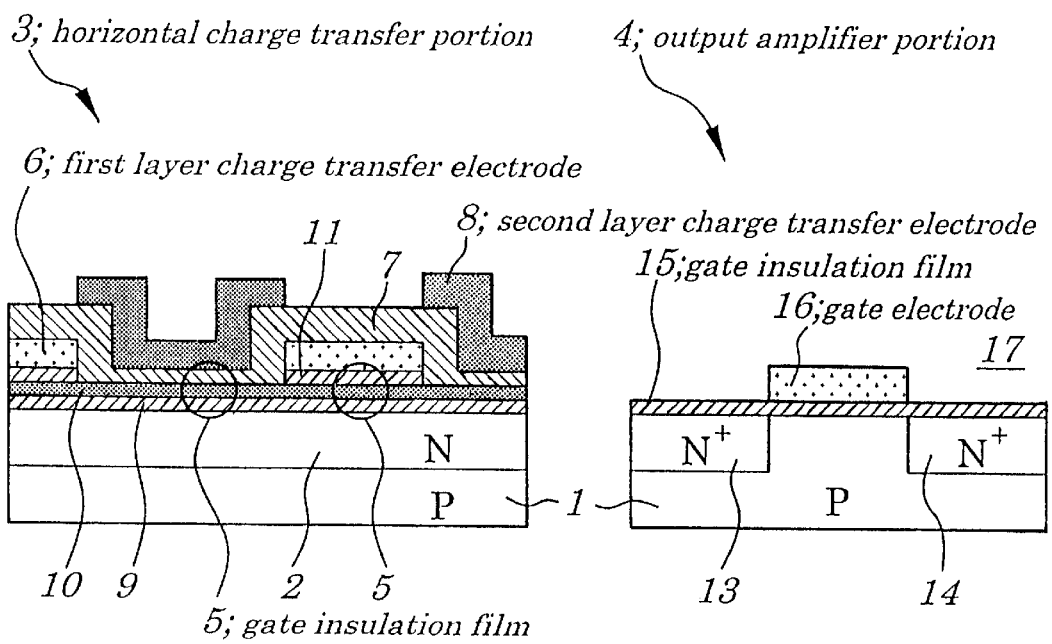
FIG. 1 is a cross-sectional view of an essential part of the solid-state imaging device of a first embodiment of the present invention.

Hereinbelow, preferred embodiments of the present invention will be described with reference to the accompanying drawings. The description will be presented in a concrete manner using the embodiments. Re: First Embodiment:

FIG. 1 shows a cross-sectional view of an essential part of the solid-state imaging device of a first embodiment of the present invention. FIGS. 2 to 8 show a series of steps of a method of producing the solid-state imaging device of the first embodiment of the present invention.

As shown in the drawings, formed in a solid-state imaging device of this embodiment is an n-type semiconductor layer 2 which is formed on a semiconductor substrate 1 of p-type monocrystalline silicon to serve as a charge transfer path. Further, formed on the semiconductor substrate 1 are a horizontal charge transfer portion 3 and an output amplifier portion 4.

The horizontal charge transfer portion 3 is provided with: a first layer charge transfer electrode 6 constructed of a polysilicon film and the like which is formed on the n-type semiconductor layer 2 through a gate insulation film 5 having a thickness of approximately 850 angstroms; and, a second layer charge transfer electrode 8. constructed of a polysilicon film and the like which is formed on the n-type semiconductor layer 2 through the gate insulation film 5, first layer charge transfer electrode 6, and an oxide film 7 having a thickness of approximately 2000 angstroms. The gate insulation film 5 is constructed of a multilayer film, which comprises a nitride film having a thickness of approximately 200 angstroms sandwiched between a thermal oxidation film 9 having a thickness of approximately 500 angstroms; and, a CVD oxidation film 11 having a thickness of approximately 150 angstroms.

As is clear from the above, the gate insulation film 5 is so designed as to have a thickness amply sufficient to keep the transfer efficiency high in the horizontal charge transfer portion 3. Incidentally, though a photodetector is formed in another region of the p-type semiconductor substrate 1, it is omitted in the drawings.

The oxide film 7 covering the first layer charge transfer portion 6 has its own upper and side portions increased in thickness so as to be sufficiently isolated from the second layer charge transfer portion 8. In this oxide film 7, the CVD oxidation film formed in the upper and the side portions of the first layer charge transfer portion 6 is subjected to a subsequent oxidation process of the polysilicon film of the first layer charge transfer portion 6 to increase its thickness.

On the other hand, the output amplifier portion 4 is constructed of a MOS transistor 17. This transistor 17 comprises: a source region 13 and a drain region 14, each of which is constructed of an n-type semiconductor region; and, a gate electrode 16 constructed of a polysilicon film and the like formed on the p-type semiconductor substrate 1 through the gate insulation film (i.e., oxide film) 15, wherein the gate insulation film 15 is so designed as to have a thickness suitable for obtaining a predetermined mutual conductance capable of increasing the gain of said output amplifier portion. Incidentally, the vertical charge transfer portion has substantially the same construction as that of the horizontal charge transfer portion 3.

Now, with reference to FIGS. 2 to 7, a method of producing the solid-state imaging device of the present invention will be described in the order of its process steps.

Figure 2:
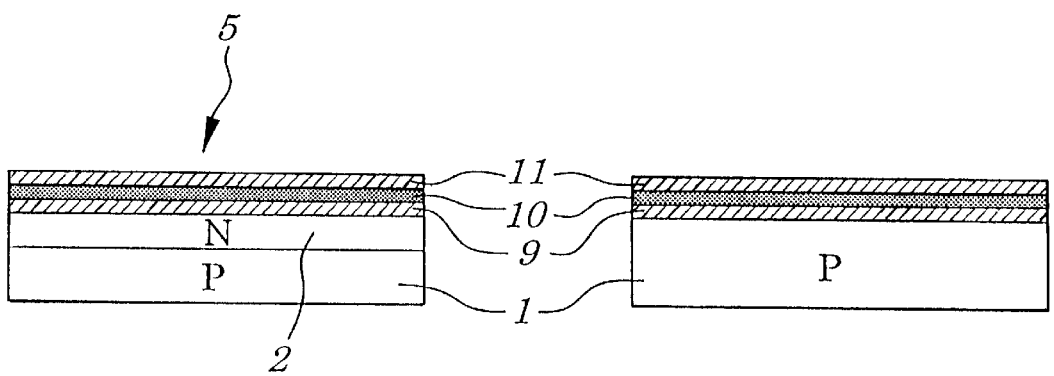
FIGS. 2 to 8 show a series of steps of a method of producing the solid-state imaging device of the first embodiment of the present invention.

First, as shown in FIG. 2, by using the p-type semiconductor substrate 1 on which the n-type semiconductor substrate 2 is previously formed, the following films are formed in a stacking manner together in the order of mention in a region where both the horizontal charge transfer portion 3 and the output amplifier portion 4 are to be formed: a thermal oxidation film 9 formed through a thermal oxidation process to have a film thickness of approximately 500 Å; a nitride film 10 formed through a CVD process to have a film thickness of approximately 200 Å; and, a first CVD oxidation film 11 formed through a CVD process to have a film thickness of approximately 150 Å. As a result, formed in the horizontal charge transfer portion 3 is a gate insulation film 5 having a thickness of approximately 850 Å. At this time, also formed in the output amplifier portion 4 are: the thermal oxidation film 9; the nitride film 10; and, the CVD oxidation film 11.

Figure 3:
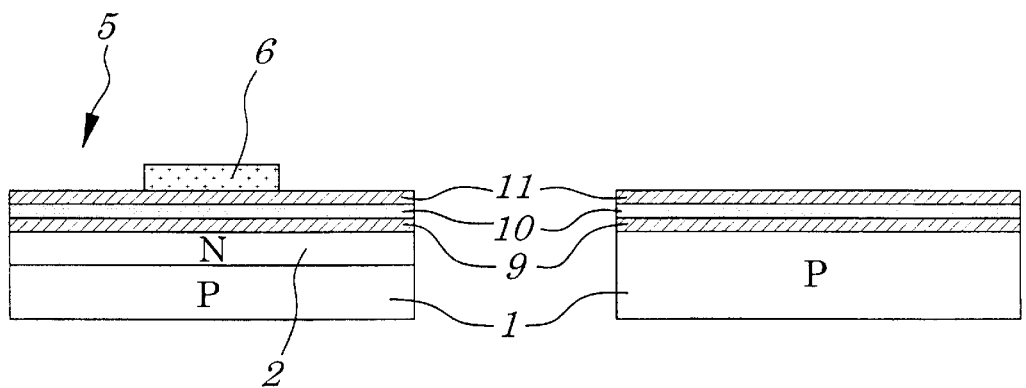

After that, as shown in FIG. 3, after a polysilicon film is formed over the entire surface of the the CVD oxidation film 11 through the CVD process, patterning is conducted using a photolithography process so that a first layer charge transfer electrode 6 is formed in the horizontal charge transfer portion 3.

Figure 4:
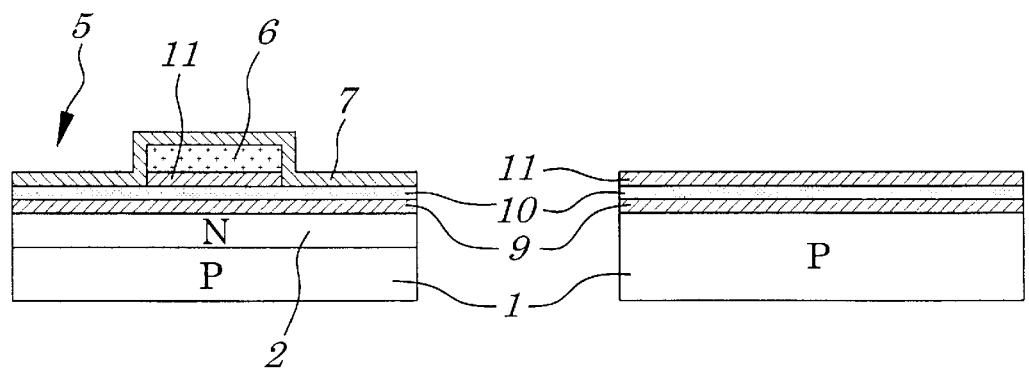

Subsequent to the above, as shown in FIG. 4, after all the high-temperature CVD oxidation film 11 other than one directly under the first layer charge transfer electrode 6 is removed, another CVD oxidation film 7 having a thickness of 150 Å is newly formed through a high-temperature (approximately 820° C.) CVD process, which is capable of producing a close-grained oxide film.

Figure 5:
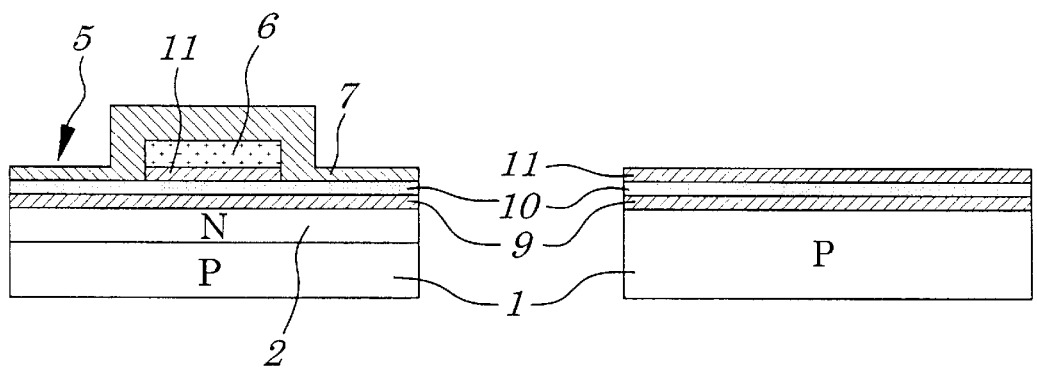

Then, as shown in FIG. 5, the polysilicon film forming the first layer charge transfer electrode 6 is subjected to an oxidation process to have its own upper and side surfaces oxidized, so that the oxidation film 7 has its own upper and side surfaces increased in thickness up to approximately 2000 Å for the sake of providing sufficient insulation between the first layer charge transfer electrode 6 and a second layer charge transfer electrode 8 which will be formed later.

Figure 6:
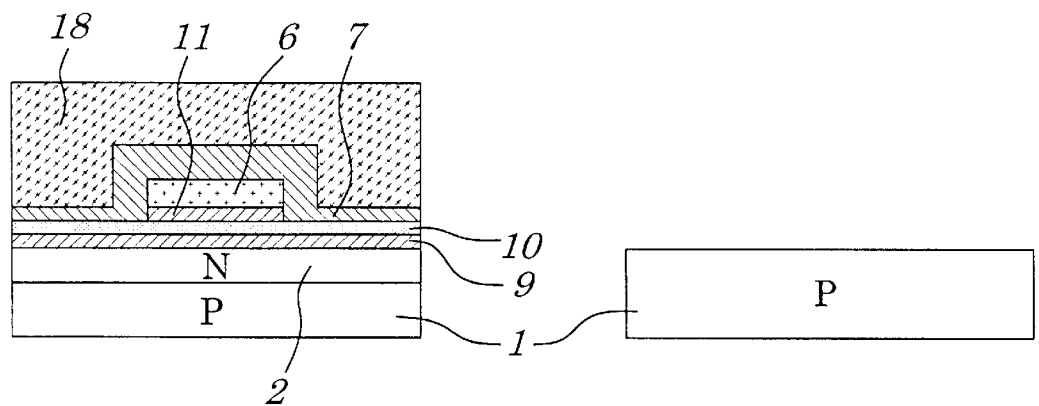

Next, as shown in FIG. 6, a photoresist coating is applied to a region where the horizontal charge transfer portion 3 is formed, so that a photoresist film 18 is formed. This photoresiste film 18 is used as a mask in etching the thermal oxidation film 9, nitride film 10 and the CVD oxidation film 11 all of which are present in a region where the output amplifier portion 4 is formed, and are therefore removed through the above etching.

Figure 7:
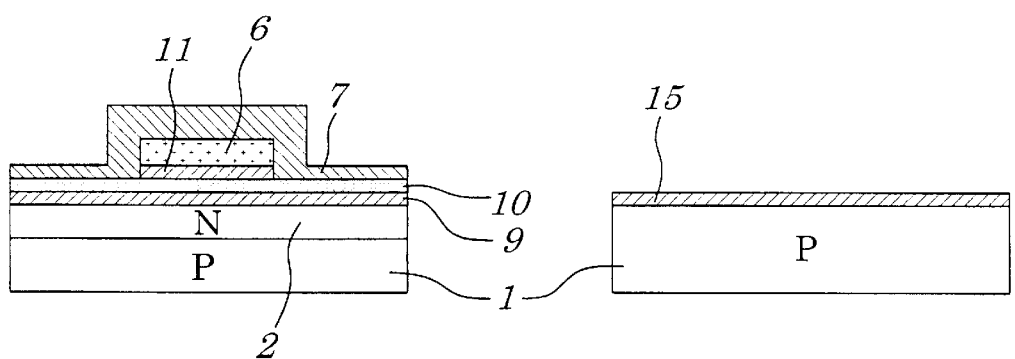

Subsequent to the above, as shown in FIG. 7, after the photoresist film 8 is removed, formed in the output amplifier portion 4 through a thermal oxidation process is a gate insulation film (i.e., thermal oxidation film) 15 having a thickness of approximately 400 Å. Consequently, it is possible to for the gate insulation film 15 to have a thickness suitable for obtaining a predetermined mutual conductance capable of increasing the gain of the output amplifier portion 4. At the same time when the thermal oxidation process is conducted, since the first layer charge transfer electrode 6 of the horizontal charge transfer portion 3 is further oxidized, its oxidation film 7 is increased in thickness up to approximately 2500 Å. Due to this, more sufficient insulation is provided between the first layer charge transfer electrode 6 and the second layer charge transfer electrode 8.

Figure 8:
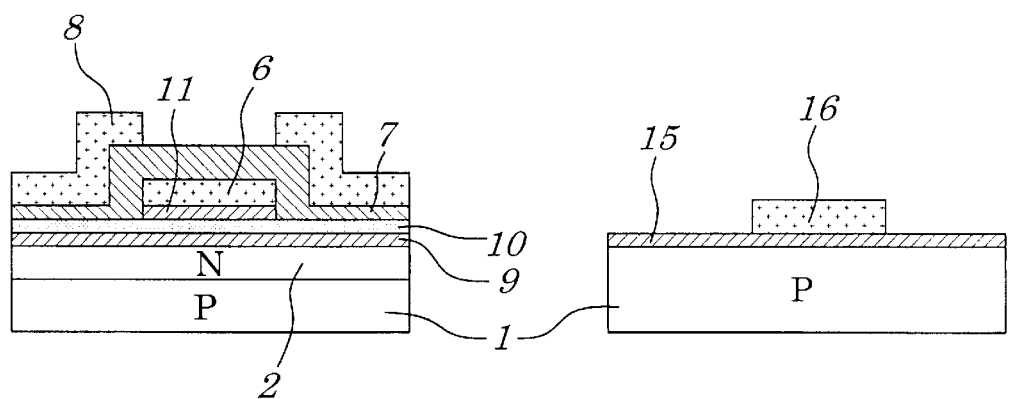

Next, as shown in FIG. 8, by using a CVD process, a polysilicon film is formed over the entire surface of the oxidation film 7, 15. After that, patterning is conducted by a photolithography process, so that the second layer charge transfer electrode 8 and the gate electrode 16 are formed in the horizontal charge transfer portion 3 and the output amplifier portion 4, respectively. Then, by self alignment using the gate electrode 16 as a mask, an n-type impurity is ion-implanted in the semiconductor substrate 1 to form an n-type source electrode 13 and an n-type drain electrode 14, so that a MOS transistor 17 is produced. As is clear from the above, the solid-state imaging device shown in FIG. 1 is produced.

Figure 9:
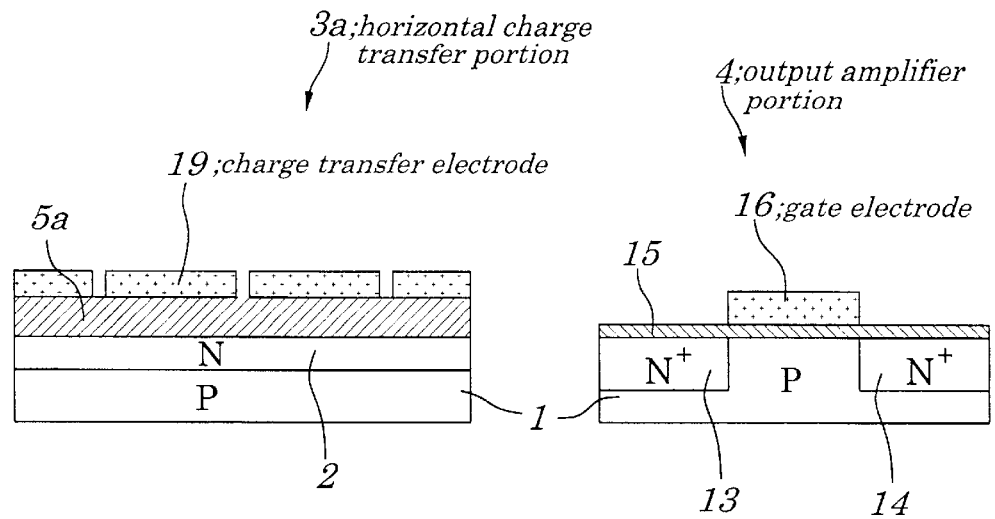
FIG. 9 is a cross-sectional view of an essential part of the solid-state imaging device of a second embodiment of the present invention.

As described above, in the construction of this embodiment, the gate insulation film 5 of the horizontal charge transfer portion 3 has a thickness sufficient to keep a predetermined transfer efficiency, and the gate insulation film 15 of the output amplifier portion 4 has a thickness suitable for obtaining a predetermined mutual conductance capable of increasing the gain of the output amplifier portion 4. Consequently, it is possible for to keep the predetermined transfer efficiency in the charge transfer portion and also to improve in gain the output amplifier portion. Re: Second embodiment of the present invention:

FIG. 9 is a cross-sectional view of an essential part of the solid-state imaging device of a second embodiment of the present invention. FIGS. 10 to 13 show a series of steps of a method of producing the solid-state imaging device of the second embodiment of the present invention.

The method of producing the solid-state imaging device of this second embodiment differs from that of the first embodiment in that a horizontal charge transfer portion 3a is constructed of a single-layer charge transfer electrode 19 and a single-layer gate insulation film 5a.

In other words, as shown in the same drawing, in the horizontal charge transfer portion 3a, a charge transfer electrode 19 constructed of a polysilicon film and the like is formed through the gate insulation film 5a. Incidentally, other than the above-mentioned point, there is substantially no difference in construction between the second embodiment of the present invention and the prior art. Consequently, in FIG. 9, the parts which are the same as ones in the prior arts have been given the same reference numerals and are not further explained.

Now, with reference to FIGS. 10 to 13, a method of producing the solid-state imaging device of this embodiment will be described.

Figure 10:
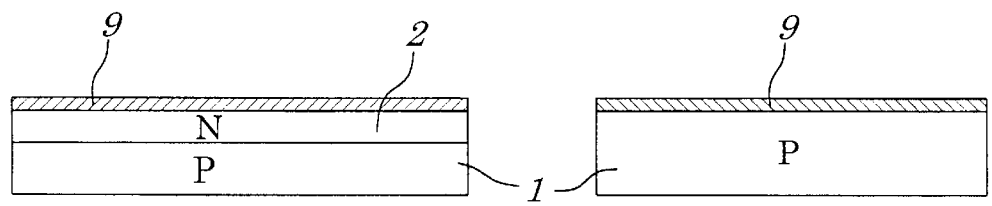
FIGS. 10 to 13 show a series of steps of a method of producing the solid-state imaging device of the second embodiment of the present invention.

First, as shown in FIG. 10, by using the p-type semiconductor substrate 1 on which the n-type semiconductor layer 2 has been previously formed, a thermal oxidation film 9 having a thickness of approximately 500 Å is formed through a thermal oxidation process on each of the horizontal charge transfer portion 3a and the output amplifier portion 4.

Figure 11:
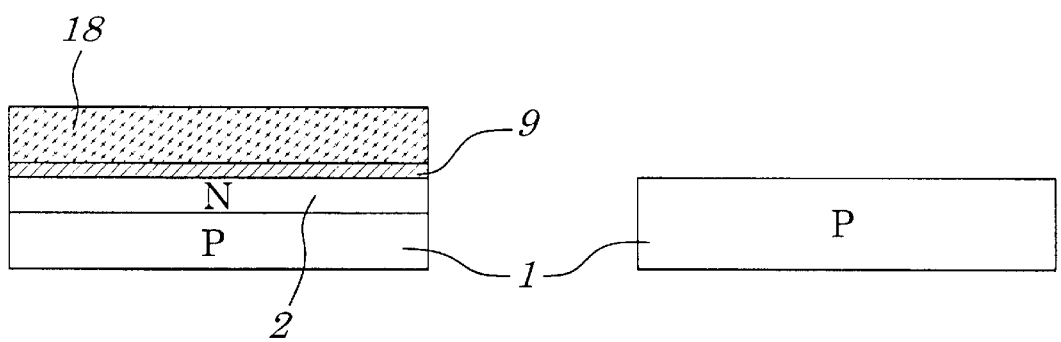

Subsequent to the above, as shown in FIG. 11, a photoresist 18 is applied to a region where the horizontal charge transfer portion 3a is formed. After that, by using the thus applied photoresist 18 as a mask, the thermal oxidation film 9 present in a region where the output amplifier portion 4 is formed is removed by etching.

Figure 12:
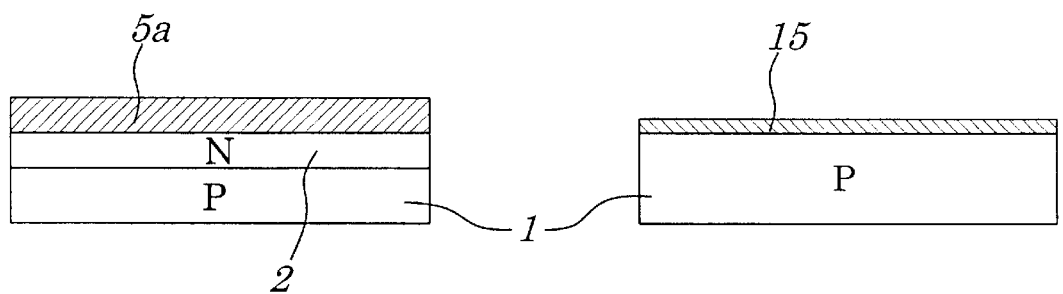

Then, as shown in FIG. 12, the photoresist 18 is removed. After that, a gate insulation film 15 having a thickness of approximately 400 Å is formed in the output amplifier portion 4 through a thermal oxidation process. At this time, the gate insulation film 15 is so formed as to have a thickness suitable for obtaining a predetermined mutual conductance capable of increasing the gain of the output amplifier portion 4. Also increased in thickness at this time of the thermal oxidation process is the oxidation film 9 which increases in thickness up to approximately 1700 Å to form a gate insulation film 5a of the horizontal charge transfer portion, whereby the gate insulation film 5a is so formed as to have a thickness sufficient to keep the predetermined transfer efficiency.

Figure 13:
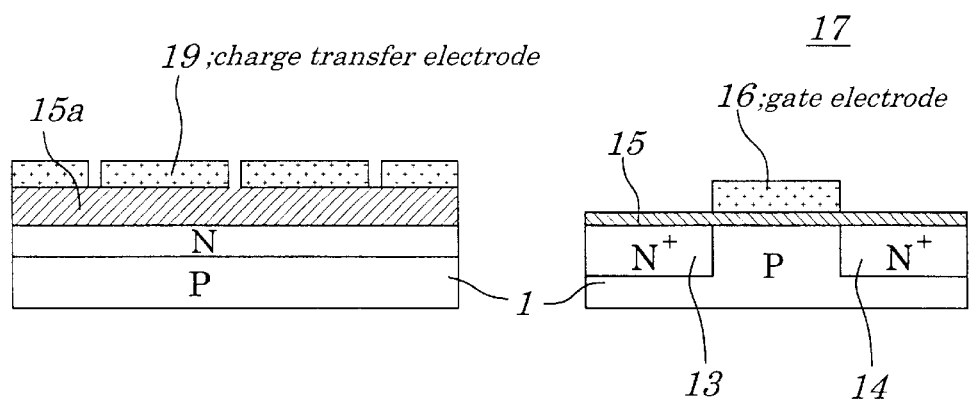
Figure 14:
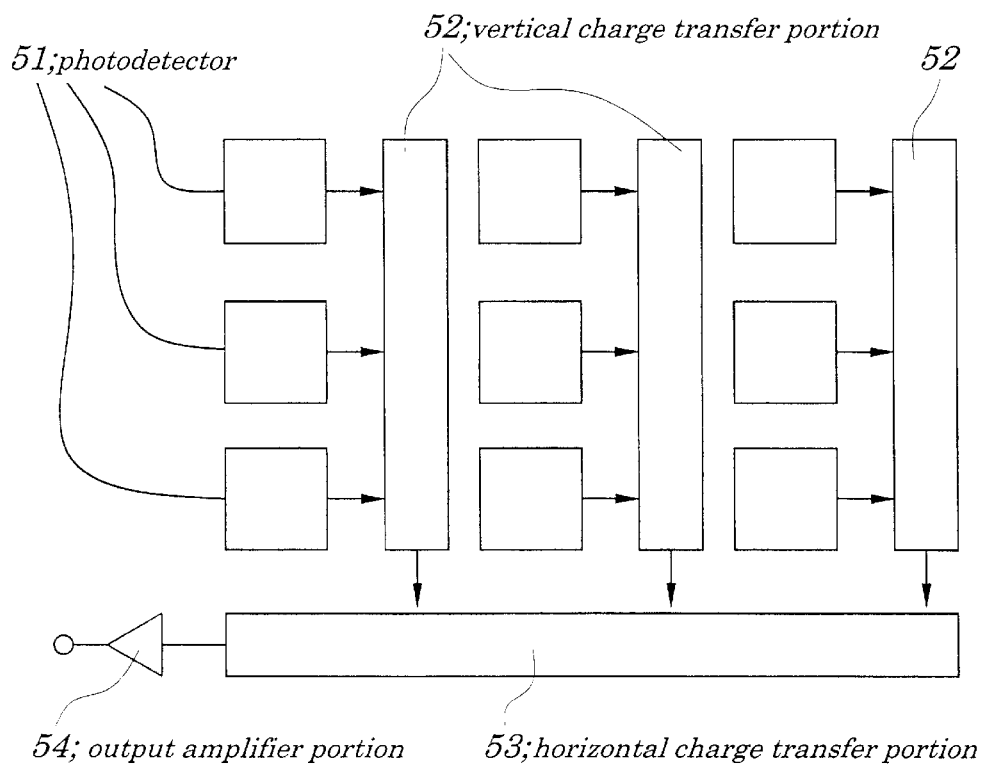
FIG. 14 is, for showing the first prior art, a schematic circuit diagram of a conventional type solid-state imaging device used in the interline transfer system.
Figure 15:
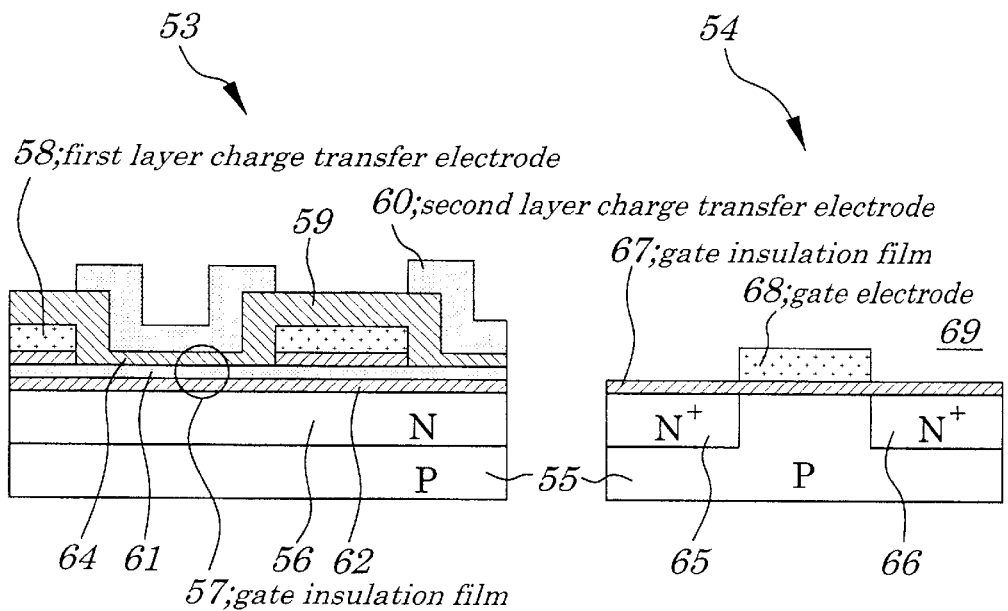
FIG. 15 is a cross-sectional view of an essential part of the solid-state imaging device, illustrating its multilayer construction.
Figure 16:
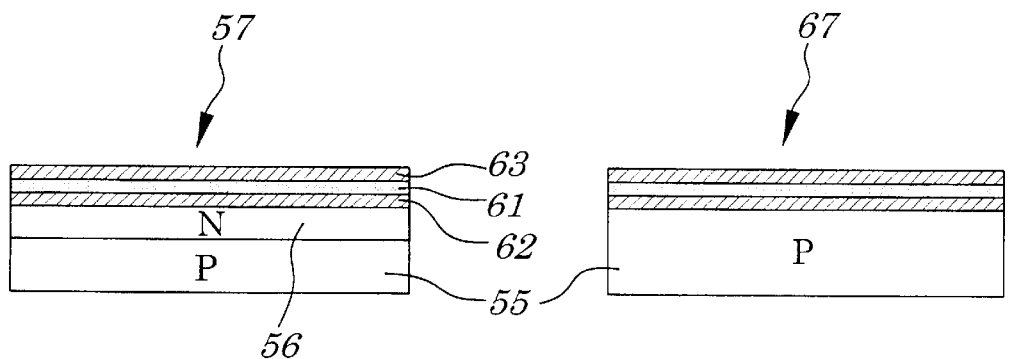
FIGS. 16 to 20 show a series of steps of a method of producing the solid-state imaging device of the second embodiment of the present invention.
Figure 17:
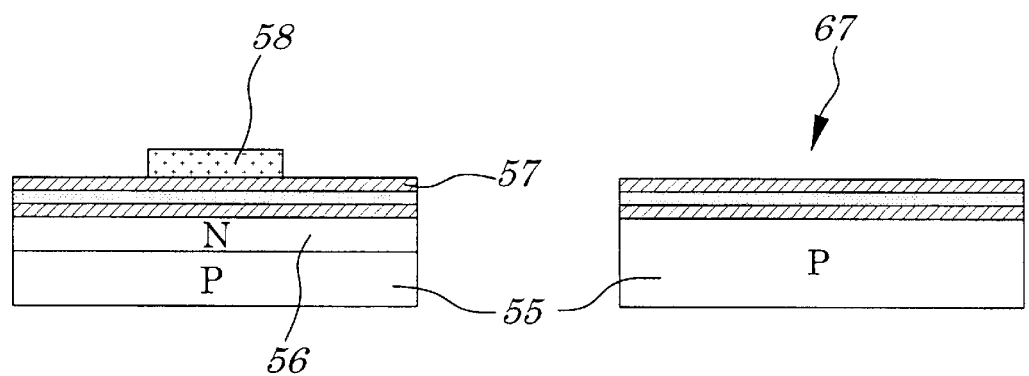
Figure 18:
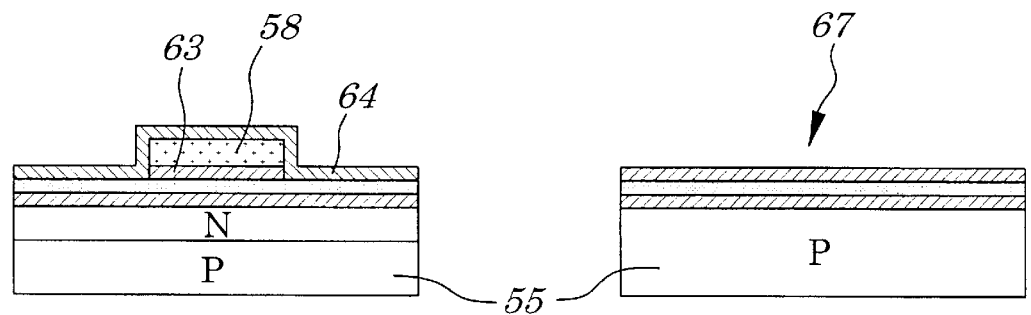
Figure 19:
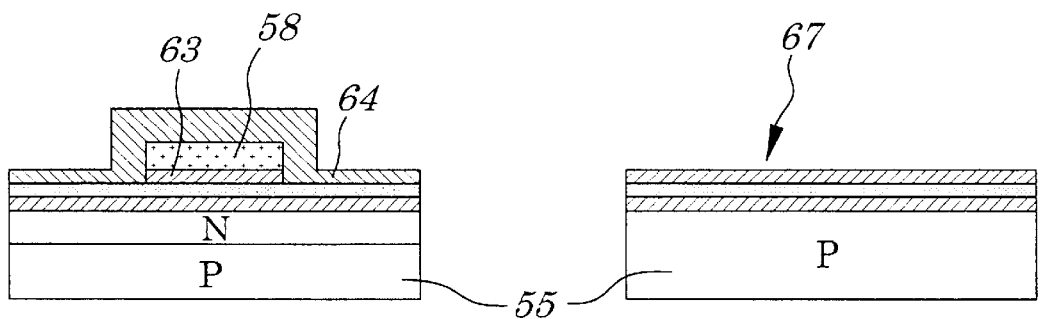
Figure 20:
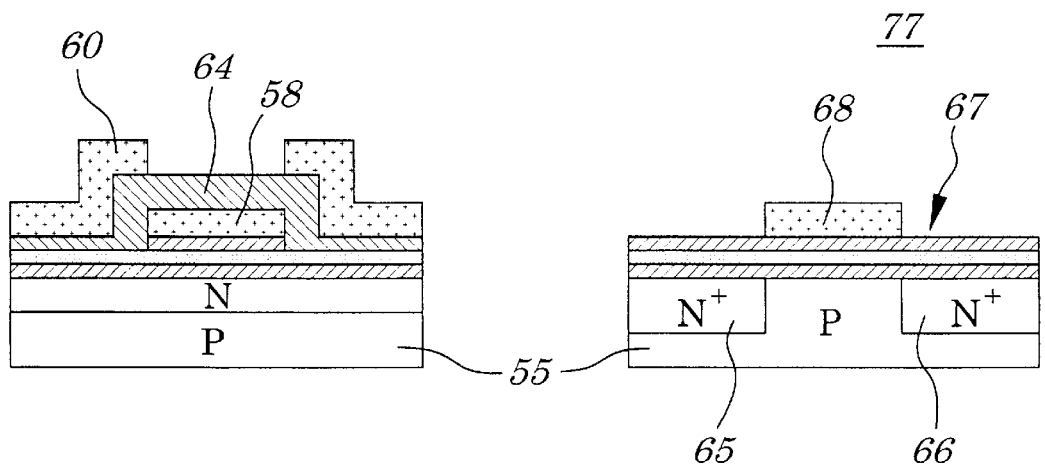
Figure 21:
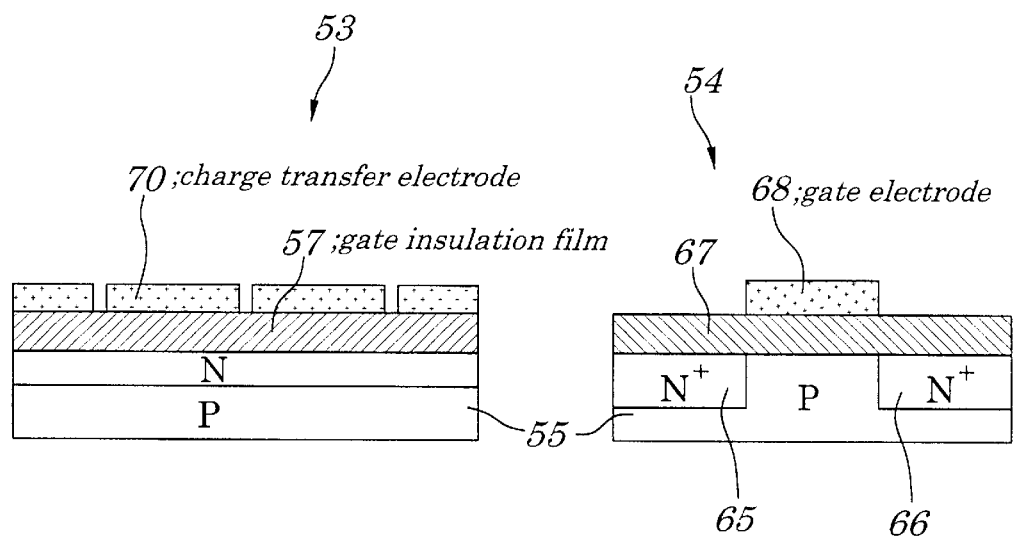
FIG. 21 is, for showing the second prior art, a cross-sectional view of an essential part of the solid-state imaging device, illustrating its multilayer construction.
Figure 22:
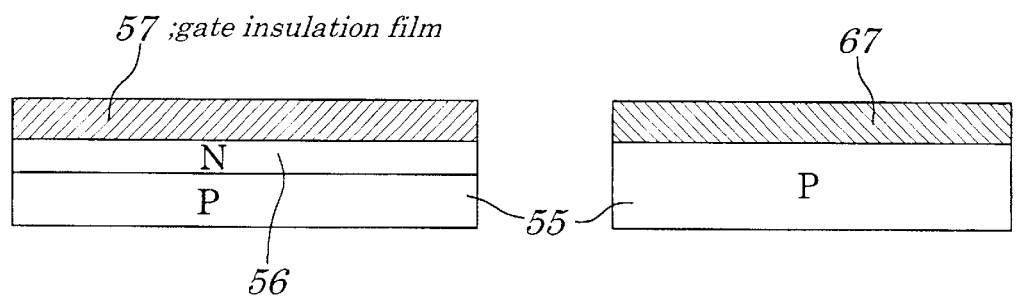
FIGS. 22 to 23 show a series of steps of a method of producing the solid-state imaging device of the second prior art.
Figure 23:
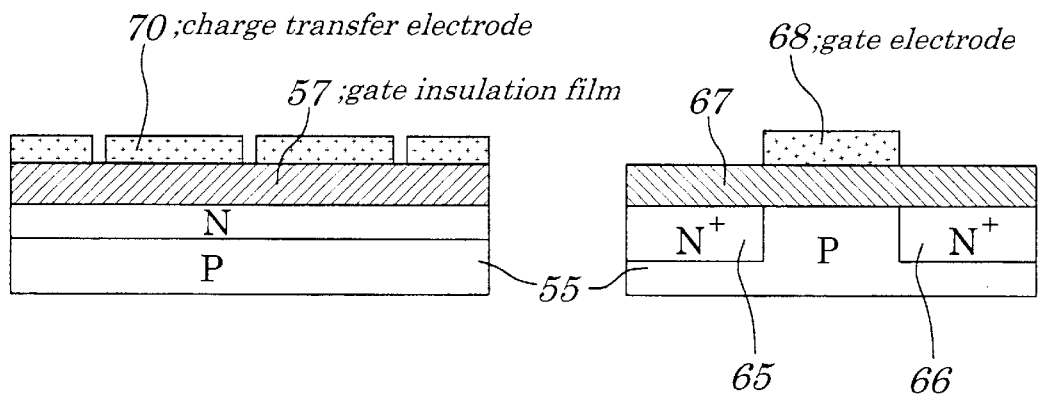
Figure 24:
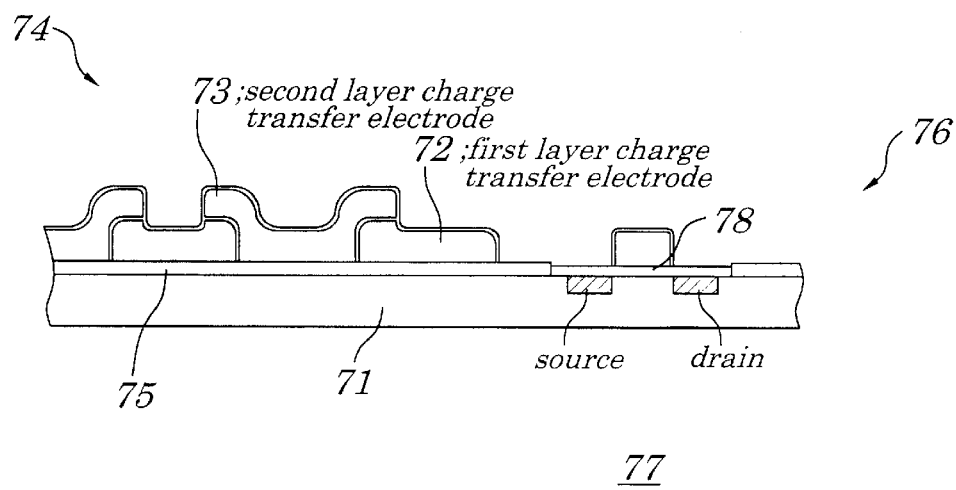
FIG. 24 is a cross-sectional view of another solid-state imaging device of a conventional type.

Subsequent to the above, as shown in FIG. 13, by using a CVD process, a polysilicon film is formed over the entire surface of the oxidation film 5a, 15. After that, patterning is conducted by a photolithography process, so that a charge transfer electrode 19 and a gate electrode 16 are formed in the horizontal charge transfer portion 3a and the output amplifier portion 4, respectively.

Then, by self alignment using the gate electrode 16 as a mask, an n-type impurity is ion-implanted in the semiconductor substrate 1 to form an n-type source electrode 13 and an n-type drain electrode 14, so that a MOS transistor 17 is produced. As is clear from the above, the semiconductor device shown in FIG. 9 is produced.

As described above, also in the construction of this second embodiment, it is possible to obtain the same effect as that of the first embodiment of the present invention.

In addition, since this second embodiment is provided with a single-layer charge transfer electrode 19, it is simple in construction, and, therefore is capable of simlifying its production process.

Though the embodiments of the present invention have been described above with reference to the drawings, the present invention is not limited in concrete construction to those of the above embodiments only. The present invention may include any changes in design not departing from the spirit of the present invention. For example, the number of electrodes is not limited to two or three. It may be three or more. As for the thickness of each gate insulation film, the thickness may be varied, if necessary. Further, the semiconductor substrate may be of an inversion type in conduction.

Furthermore, in the above embodiments, thought the gate insulation film of the output amplifier portion is constructed of the thermal oxidation film, it may be constructed of a CVD oxidation film which is excellent in compactness. Further, the output amplifier portion 4 may be of, for example such as a MONOS construction and the like in addition to a MOS costruction, provided that it has a MIS (Metal Insulator Semiconductor).

As described above, in the construction of the present invention: the gate insulation film of the charge transfer portion has a thickness sufficient to keeping its transfer efficiency high; and, the gate insulation film of the output amplifier portion has a thickness suitable for obtaining a mutual conductance capable of increasing the gain of the output amplifier portion. Consequently, it is possible for the present invention to keep the transfer efficiency of the charge transfer portion high and to improve the output amplifier portion in its gain.

It is thus apparent that the present invention is not limited to the above embodiments but may be changed and modified without departing from the scope and spirit of the invention.

Finally, the present application claims the priority of Japanese Patent Application No. Hei10-023200 filed on Feb. 4, 1998, which is herein incorporated by reference.

What is claimed is:

1. A method for producing a solid-state image pickup device comprising:
   a charge transfer portion for transferring an electric charge produced in a light receiving portion through photoelectric conversion from an incident light to said electric charge, and
   an output amplifier portion for detecting said electric charge to issue a signal;
   wherein said charge transfer portion is provided with a first gate insulation film having a sufficient film thickness to keep a predetermined transfer efficiency, and
   said output amplifier portion is provided with a second gate insulation film having a film thickness suitable for obtaining a predetermined mutual conductance capable of increasing the gain of said output amplifier portion;

the method comprising the steps of:

forming an insulation film, in which a multilayer film is formed by stacking a thermal oxidation film, a nitride film, and a first Chemical Vapor Deposition ("CVD") oxidation film together in the mentioned order in a region where said charge transfer portion and said output amplifier portion are formed on a semiconductor substrate;

forming a first layer charge transfer electrode in a region where said charge transfer portion is formed;

forming a second CVD oxidation film after all of said first CVD oxidation film, except said first CVD oxidation film immediately underneath said first layer charge transfer electrode, is removed;

oxidizing said first layer charge transfer electrode to increase said second CVD oxidation film in film thickness;

removing said multilayer film at said region where said output amplifier portion is formed;

forming an oxide film serving as a gate insulation film in said region where said output amplifier portion is formed, and simultaneously again oxidizing said first layer charge transfer electrode to increase further said second CVD oxidation film in film thickness; and forming a second layer charge transfer electrode through both said multilayer film and said second CVD oxidation film in said region where said charge transfer portion is formed, and simultaneously forming a gate electrode in said region where said output amplifier portion is formed.

2. The method for producing the solid-state image pickup device, as set forth in claim 1, wherein: both a source and a drain are formed in said region where said output amplifier portion is formed to form a MIS transistor, by self alignment using said gate electrode as a mask.

3. The method for producing the solid-state image pickup device, as set forth in claim 1, wherein: each of said first layer charge transfer electrode and said second layer charge transfer electrode is constructed of a polysilicon film.

* * * * *